United States Patent [19]

Nguyen et al.

[11] Patent Number: 5,260,703
[45] Date of Patent: Nov. 9, 1993

[54] DATA ENCODING AND DECODING WITHIN PRML CLASS IV SAMPLING DATA DETECTION CHANNEL OF DISK DRIVE

[75] Inventors: Hung C. Nguyen, San Jose; Brian N. Kuo, Saratoga, both of Calif.

[73] Assignee: Quantum Corporation, Milpitas, Calif.

[21] Appl. No.: 936,757

[22] Filed: Aug. 27, 1992

[51] Int. Cl.⁵ .................... H03M 9/00; H03M 13/12; G11B 5/09
[52] U.S. Cl. .................... 341/100; 341/101; 341/107; 341/95; 341/59; 360/46; 360/62
[58] Field of Search .................... 341/100, 101, 58, 59, 341/107, 106, 95; 360/40, 45, 46, 61

[56] References Cited

U.S. PATENT DOCUMENTS

| | | | |
|---|---|---|---|
| 4,337,458 | 6/1982 | Cohn et al. | 341/63 |
| 4,504,872 | 3/1985 | Peterson | 360/40 |
| 4,609,907 | 9/1986 | Adler et al. | 341/59 |
| 4,644,545 | 2/1987 | Gershenson | 341/51 |
| 4,644,564 | 2/1987 | Dolivio et al. | 375/18 |
| 4,675,652 | 6/1987 | Machado | 341/59 |
| 4,707,681 | 11/1987 | Eggenberger et al. | 341/59 |
| 4,779,072 | 10/1988 | van Gestel | 341/59 |
| 4,786,890 | 11/1988 | Marcus et al. | 341/81 |
| 4,847,871 | 7/1989 | Matsushita et al. | 375/94 |
| 5,196,849 | 3/1993 | Galbraith | 341/59 |

OTHER PUBLICATIONS

Wood et al, *Viterbi Detection of Class IV Partial Response on a Magnetic Recording Channel*, IEEE Transaction on Communications, vol. Com-34 No. 5, May 1986, pp. 454-461.

Schmerbeck et al., *A 27 MHz Mixed Analog/Digital Magnetic Recording Channel DSP Using Partial Response Signalling with Maximum Likelihood Detection*, Proc. of IEEE ISSCC91 Session 8 pp. 136-137, 304, and 96-97, 256 Slide Supplement.

Wood et al., *An Experimental Eight Inch Disc Drive with 100MBytes Per Surface*, IEEE Transaction on Magnetics, vol. MAG-20 No. 5, Sep. 1984, pp. 698-702.

Kobayashi et al., *Application of Partial Response Channel Coding To Magnetic Recording Systems*, IBM Journal of Research and Development, Jul. 1970, pp. 368-375.

Kobayashi, *Application of Probabilistic Decoding to Digital Magnetic Recording Systems*, IBM Journal of Research of Research and Development, Jan. 1971, pp. 64-74.

Dolivio, *Signal Processing of High Density Magnetic Recording*, Proc. 1989 IEEE VLSI and Computer Peripherals, Hamburg FRG, May 1989, pp. 1-91 to 1-96.

Coker et al. *Implementation of PRML in a Rigid Disk Drive*, IEEE Transaction of Magnetics, vol. 27 No. 6, Nov. 1991.

Cideciyan et al. *A PRML System for Digital Magnetic Recording*, IEEE Journal on Selected Areas of Communication, vol. 10 No. 1, Jan. 1992, pp. 38-56.

Markus et al. *Finite State Modulation Codes for Data Storage*, IEEE Journal on Selected Areas of Communication, vol. 10 No. 1, Jan. 1992, pp. 5-37.

Primary Examiner—Howard L. Williams
Attorney, Agent, or Firm—David B. Harrison

[57] ABSTRACT

A serializer/deserializer encoder-decoder for a disk drive achieves increased storage capacity through the use of partial response maximum likelihood class IV (PRML-IV) coding. Reduction of hardware requirements is realized by the integration of similar read and write mode functions into common circuit elements in order to reduce duplication. To this end, a data word selector selectively receives or sends data words in the write/read mode, respectively, from a data sequencer. Dependent upon the mode the data words are either provided to an encoder or received from a decoder for translation to/from code words. The encoder-decoder sends or receives the code words to a code word selector which in turn connects with the serializer-deserializer for coupling with the write or read channel.

13 Claims, 5 Drawing Sheets

DATA ENCODING AND DECODING WITHIN PRML CLASS IV SAMPLING DATA DETECTION CHANNEL OF DISK DRIVE

REFERENCE TO RELATED APPLICATION

The present invention is related to U.S. patent application Ser. No. 07/937,064 filed on the same date as the application resulting in this patent and entitled DISK DRIVE USING PRML CLASS IV SAMPLING DATA DETECTION WITH DIGITAL ADAPTIVE EQUALIZATION, the disclosure of which is hereby incorporated herein by reference.

FIELD OF THE INVENTION

The present invention relates to encoding and decoding of data within an 8/9ths coded and synchronized, partial response, maximum likelihood ("PRML") detection data channel. More particularly, the present invention relates to methods and apparatus for encoding, decoding and serializing data within a partial response, class IV, maximum likelihood (hereinafter referred to as "PR4,ML") data channel e.g. of a disk drive data storage subsystem.

BACKGROUND OF THE INVENTION

Conventional disk drives have employed peak detection techniques in order to recover digital data written as saturation recording onto a magnetizable surface media of a rotating disk. With peak detection techniques, it is necessary to space flux transitions sufficiently apart so that analog peaks in the recovered data stream may be identified and the corresponding data recovered. In order to achieve reasonable bandwidths in data channels, it has been customary to employ data coding techniques. One such technique has been to use a (1,7) RLL code. In this code, flux transitions can be no closer together than every other clock bit time period ("bit cell") nor farther apart than eight clock bit cells. (1,7) RLL codes are known as "rate two-thirds" codes, in the sense that two data bits are coded into three code bits. Thus, with a rate two-thirds code, one third of the user storage area of the storage disk is required for code overhead.

One way to decrease the code overhead is to employ a code in which flux transitions are permitted in adjacent bit cells. One such code is a (0,4,4) code. The (0,4,4) code is generally thought of as a rate eight-ninths code, meaning that nine code bits are required for eight incoming data bits. (Theoretically, the (0,4,4) code ratio is somewhat higher, approaching 0.961) Thus, this code is significantly more efficient than a rate two-thirds code, such as (1,7) RLL. Use of a (0,4,4) code results in a significantly greater net user data storage capacity on the disk surface, given a constant bit cell rate. However, when flux transitions occur in adjacent bit cells, as is the case with an (0,4,4) code, intersymbol interference ("ISI") results. Conventional peak detection techniques are not effective or reliable in recovering data coded in an eight-ninths code format, such as (0,4,4).

The zero in the (1,4,4) code denotes that flux transitions may occur in directly adjacent bit cells of the coded serial data stream. The first "4" denotes that a span of no more than four zeros occurs between ones in the encoder output. The second "4" signifies that the bit cell stream has been divided into two interleaves: an even interleave, and an odd interleave; and, it denotes that there can be a span of no more than four zeros between ones in the encoder output of either the odd interleave or the even interleave.

It is known that partial response signalling enables improved handling of ISI and allows more efficient use of the bandwidth of a given channel. Since the nature of ISI is known in these systems, it may be taken into account in the decoding/detection process. Partial response transmission of data lends itself to synchronous sampling and provides an elegant compromise between error probability and the available spectrum. The partial response systems described by the polynomials $1+D$, $1-D$, and $1-D^2$ are known as duobinary, dicode and class IV (or "PR4"), respectively, where D represents one bit cell delay and $D^2$ represents 2 bit cell delays (and further where $D=e^{-j\omega T}$, where $\omega$ is a frequency variable in radians per second and T is the sampling time interval in seconds). The PR4 magnitude response plotted in FIG. 1 hereof and given the notation $|1-D^2|$ emphasizes midband frequencies and results in a read channel with increased immunity to noise and distortion at both low and high frequencies. In magnetic recording PR4 is a presently preferred partial response system, since there is a close correlation between the idealized PR4 spectrum as graphed in FIG. 1, and the natural characteristics of a magnetic data write/read channel.

In order to detect user data from a stream of coded data, not only must the channel be shaped to a desired partial response characteristic, such as the PR4 characteristic, but also a maximum likelihood ("ML") sequence estimation technique is needed. The maximum likelihood sequence estimation technique determines the data based upon an analysis of a number of consecutive data samples taken from the coded serial data stream, and not just one peak point as was the case with the prior peak detection methods.

One maximum likelihood sequence estimation algorithm is known as the Viterbi detection algorithm, and it is well described in the technical literature. Application of the Viterbi algorithm to PR4 data streams within a magnetic recording channel is known to improve detection of original symbol sequences in the presence of ISI and also to improve signal to noise ratio over comparable peak detection techniques.

In an article entitled "Viterbi Detection of Class IV Partial Response on a Magnetic Recording Channel" appearing in *IEEE Trans. on Communications*, vol. Com-34, No. 5, May 1986, pp. 434–461, authors Wood and Peterson explain the derivation of PR4 as being formed by subtracting waveforms two bit intervals apart, thereby forming an analog domain ternary "eye" pattern graphed herein in FIG. 2.

The Viterbi algorithm provides an iterative method of determining the "best" route along the branches of a trellis diagram, such as the one shown in FIG. 3 hereof, for example. If, for each trellis branch, a metric is calculated which corresponds to the logarithm of the probability for that branch, then the Viterbi algorithm may be employed to determine the path along the trellis which accumulates the highest log probability, i.e., the "maximum likelihood" sequence. Since the Viterbi algorithm operates upon a sequence of discrete samples $\{Y_k\}$, the read signal is necessarily filtered, sampled, and equalized.

While PRML has been employed in communications signalling for many years, it has only recently been applied commercially within magnetic hard disk drives.

One recent application is described in a paper by Schmerbeck, Richetta, and Smith, entitled "A 27 MHz Mixed Analog/Digital Magnetic Recording Channel DSP Using Partial Response Signalling with Maximum Likelihood Detection", *Proc.* 1991 *IEEE International Solid State Circuits Conference*, pp. 136–137, 304, and pp. 96, 97 and 265 Slide Supplement. While the design reported by Schmerbeck et al. appears to have worked satisfactorily, it has drawbacks and limitations which are overcome by the present invention. One drawback of the reported approach was its design for transducers of the ferrite MiG type or of the magnetoresistive type which simplified channel equalization requirements. Another drawback was the use of a single data transfer rate which significantly simplified channel architecture. A further drawback was the use of a dedicated servo surface for head positioning within the disk drive, thereby freeing the PR4, ML data channel from any need for handling of embedded servo information or for rapid resynchronization to the coded data stream following each embedded servo sector.

Prior Viterbi detector architectures and approaches applicable to processing of data sample sequences taken from a communications channel or from a recording device are also described in the Dolivo et al. U.S. Pat. No. 4,644,564. U.S. Pat. No. 4,504,872 to Peterson describes a digital maximum likeihood detector for class IV partial response signalling. An article by Roger W. Wood and David A. Peterson, entitled: "Viterbi Detection of Class IV Partial Response on a Magnetic Recording Channel" *IEEE Trans. on Comm.* Vol. Com-34, No. 5, May 1986, pp. 454–466 describes application of Viterbi detection techniques to a class IV partial response in a magnetic recording channel. An article by Roger Wood, Steve Ahigrim, Kurt Hallarnasek and Roger Stenerson entitled: "An Experimental Eight-Inch Disc Drive with One-Hundred Megabytes per Surface", *IEEE Trans. on Magnetics*, Vol. Mag-20, No. 5, Sepember 1984, pp 698–702 describes application of class IV partial response encoding and Viterbi detection techniques as applied within an experimental disk drive. A digital Viterbi detector capable of withstanding lower signal to noise ratios is described in Matsushita et al. U.S. Pat. No. 4,847,871. These documents are representative examples of the known state of the prior art.

Given the need to miniaturize and consolidate circuit functions within one or a few application-specific integrated circuits ("ASICs"), a hitherto need has remained for efficient and effective encoding and decoding circuitry with a minimum amount of circuit complexity.

SUMMARY OF THE INVENTION

A general object of the present invention is to provide improved data encoding and decoding within a PR4, ML channel of a disk drive. This channel includes a highly programmable analog section and a highly programmable and adaptive digital section in order to adapt to particular hardware tolerances and data channel conditions of the disk drive.

A more specific object of the present invention is to provide an improved encoder-decoder/serializer-deserializer (herein "ENDEC/SERDES") for use in a (0,4,4) PR4, ML data channel.

Yet another object of the present invention is to provide an efficient pre-coder and an efficient post-coder for a (0,4,4) PR4, ML data channel.

One more object of the present invention is to provide efficient and effective encoding and decoding circuitry for use within a digital ASIC of a PR4, ML channel, such as a disk drive read and write channel.

In accordance with principles of the present invention, a serializing/deserializing encoder-decoder is provided for a disk drive. The drive includes a serial write data channel leading to a data transducer head for writing data to a rotating data storage disk during a write mode, a serial read data channel leading from the data transducer head for reading data from the disk during a read mode, and a data sequencer for writing sequences of data words to the data storage disk via the encoder-decoder and the write data channel during write mode, and for reading sequences of data words from the disk via the read data channel and the encoder-decoder during read mode. In the present invention, the serializing-/deserializing encoder-decoder comprises a data word selector for selectively receiving data words from the data sequencer means during write mode, and for selectively sending data words to the data sequencer means during read mode; an encoder which receives data words from the data word selector means during write mode and converts the data words into predetermined code words in accordance with a predetermined coding pattern; a decoder for receiving code words from a code word selector during read mode and for converting the code words into data words in accordance with the predetermined coding pattern, the code word selector being connected to receive and selectively put out code words from the encoder during write mode and connected to receive and selectively put out code words to the decoder during read mode; and a serializer/deserializer for converting code words received from the code word selector means into a serial data stream and for sending said stream to said write data channel during write mode, and for converting a serial data stream received from said read data channel into code words and for sending said code words to said code word selector during read mode.

In one aspect of the present invention, the data channels of the disk drive implement a PR4,ML synchronously sampled data arrangement, the data word selector comprises an eight bit selector, the code word selector comprises a nine bit selector, and the encoder and the decoder implement the coding pattern in accordance with a predetermined eight bit word to nine bit code word pattern.

In another aspect of the present invention, the serializer/deserializer comprises a universal parallel load and unload, serial shift nine bit shift register and associated registers and timing arrangements between a bit clock and a byte clock which eliminates potential loss of data during loading and shifting operations.

In yet another aspect of the present invention the data word selector comprises a multiplexer having at least three inputs, and a first register for holding an output selected from one of the inputs by the multiplexer, the first register having an output connected to the encoder and to the sequencer.

In still one more aspect of the present invention, the disk drive includes a source of pseudo-random sequence data words, and the data word selector receives at one of its inputs and selectively puts out pseudo-random sequence data words to the first register.

In another aspect of the present invention, the code word selector comprises a multiplexer having one input connected to the encoder and another input connected to a parallel output path from the serializer/deserializer, and having an output connected to a second register, the second register providing an output connected to a parallel input path to the serial/deserializer and to the decoder.

In yet one more aspect of the present invention, the encoder comprises a sync/data field gate connected in parallel therewith for detecting an end of a data sync field preamble and for enabling encoding of user data words immediately following the end of the preamble.

In another aspect of the invention, the read data channel includes a postcoder for postcoding detected data samples in an (0,6,5) code format into code words in accordance with a (0,4,4) code format, and the write data channel includes a precoder for precoding code words in said (0,4,4) format into precoded data groups in the (0,6,5) format.

In a related aspect, the postcoder preferably comprises two tandem connected registers clocked at a data sampling rate and an exclusive-OR gate for comparing an incoming detected data sample with a two-register delayed data sample to provide a post coded code word, and the precoder comprises an exclusive-OR gate connected to receive incoming code words and to provide an output, and two tandem connected registers clocked at a data sampling rate, a first register for delaying the output by one clock period and for putting out said precoded data groups to the write data channel, and a second register for delaying an output of the first register by one clock period and for providing another input to the exclusive-OR gate.

These and other objects, advantages, aspects and features of the present invention will be more fully understood and appreciated upon consideration of the following detailed description of a preferred embodiment, presented in conjunction with the accompanying drawings.

SYSTEM OVERVIEW

Figure 4:
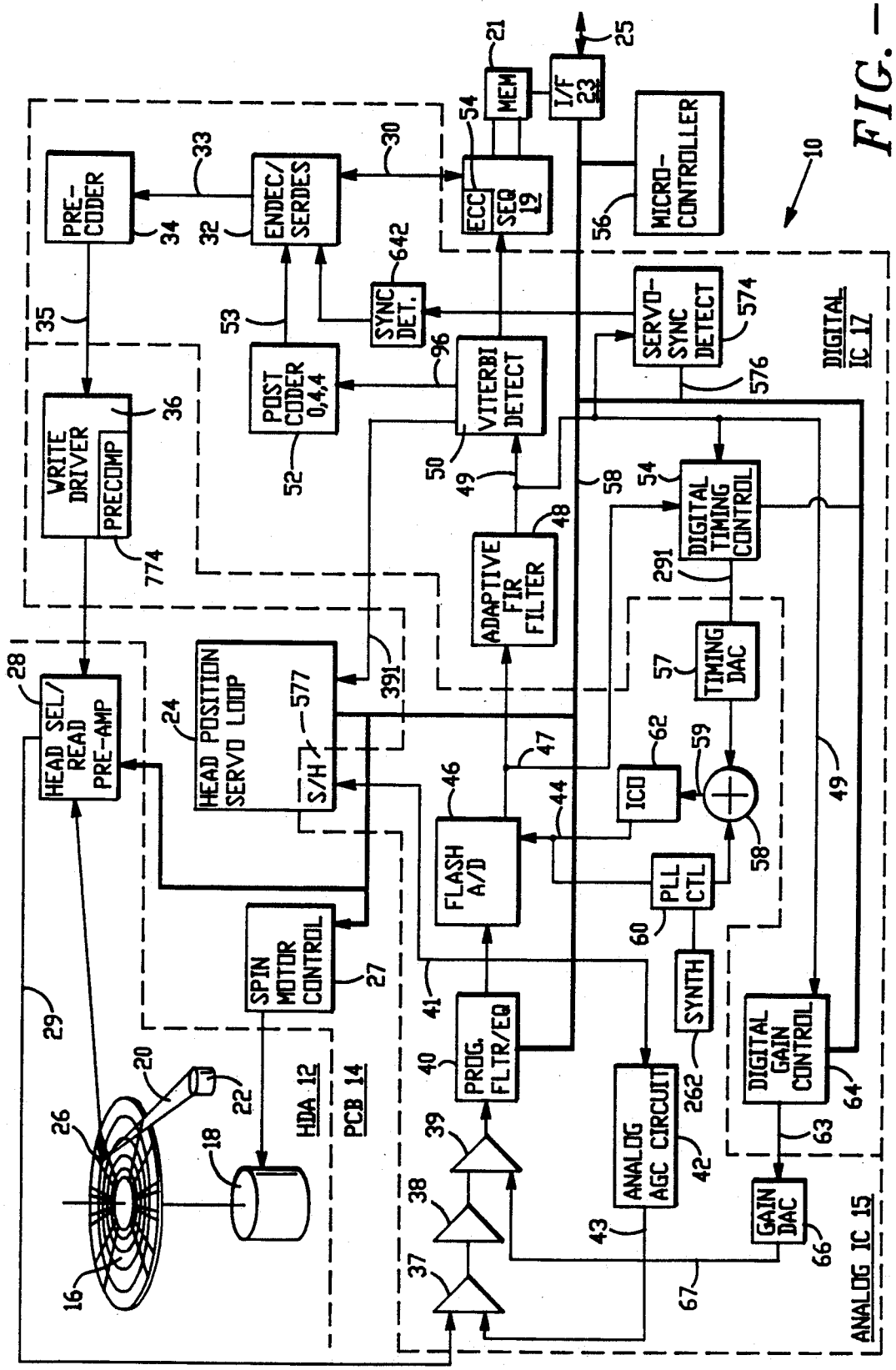
FIG. 4 is a simplified overall system block diagram of a disk drive including a PR4, ML write/read channel architecture incorporating principles and aspects of the present invention.

With reference to FIG. 4, an exemplary high performance, high data capacity, low cost disk drive 10 incorporating a programmable and adaptive PR4,ML write/read channel in accordance with the principles of the present invention includes e.g. a head and disk assembly ("HDA") 12 and at least one electronics circuit board (PCB) 14. The HDA 12 may follow a wide variety of embodiments and sizes. One example of a suitable HDA is given in commonly assigned U.S. Pat. No. 5,027,241. Another suitable HDA is described in commonly assigned U.S. Pat. No. 4,669,004. Yet another suitable HDA is described in commonly assigned U.S. Pat. No. 5,084,791. Yet another HDA arrangement is illustrated in commonly assigned, copending U.S. patent application Ser. No. 07/881,678, filed on May 12, 1992, and entitled "Hard Disk Drive Architecture". The disclosures of these patents and this application are incorporated herein by reference thereto.

The electronics PCB 14 physically supports and electrically connects the circuitry for an intelligent interface disk drive subsystem, such as the drive 10. The electronics circuitry contained on the PCB 14 includes an analog PR4, ML read/write channel application-specific integrated circuit (ASIC) 15, a digital PR4, ML read/write channel ASIC 17, a data sequencer and cache buffer controller 19, a cache buffer memory array 21, a high level interface controller 23 implementing a bus level interface structure, such as SCSI II target, for communications over a bus 25 with a SCSI II host initiator adapter within a host computing machine (not shown). A micro-controller 56 includes a micro-bus control structure 58 for controlling operations of the sequencer 19, interface 23, a servo loop 24, a spindle motor controller 27, a programmable analog filter/equalizer 40, adaptive FIR filter 48, Viterbi detector 50, and a digital timing control 54 as well as a digital gain control 64. The micro-controller 56 is provided with direct access to the DRAM memory 21 via the sequencer/memory controller 19 and may also include onboard and outboard read only program memory, as may be required or desired.

The printed circuit board 14 also carries circuitry related to the head positioner servo 24 including e.g. a separate microprogrammed digital signal processor (DSP) for controlling head position based upon detected actual head position information supplied by a servo peak detection portion of the PR4,ML read channel and desired head position supplied by the microcontroller 56. The spindle motor control circuitry 27 is provided for controlling the disk spindle motor 18 which rotates the disk or disks 16 at a desired angular velocity.

The HDA 12 includes at least one data storage disk 16. The disk 16 is rotated at a predetermined constant angular velocity by a speed-regulated spindle motor 18 controlled by spindle motor control/driver circuitry 27. An e.g. in-line data transducer head stack assembly 20 is positioned e.g. by a rotary voice coil actuator 22 which is controlled by the head position servo loop circuitry 24. As is conventional, a data transducer head 26 of the head stack assembly 20 is associated in a "flying" relationship over a disk surface of each disk 16. The head stack assembly 20 thus positions e.g. thin film data transducer heads 26 relative to selected ones of a multiplicity of concentric data storage tracks 71 defined on each storage surface of the rotating disk 16. While thin film heads are presently preferred, improvements in disk drive performance are also realized when other types of heads are employed in the disclosed PR4, ML data channel, such as MiG heads or magnetoresistive heads, for example.

The heads 16 are positioned in unison with each movement of the actuator and head stack assembly 20, and the resulting vertically aligned, circular data track locations are frequently referred to as "cylinders" in the disk drive art. The storage disk may be an aluminum alloy or glass disk which has been e.g. sputter-deposited with a suitable multi-layer magnetic thin film and a protecting carbon overcoat in conventional fashion, for example. Other disks and magnetic media may be employed, including plated media and or spin-coated oxide media, as has been conventional in drives having lower data storage capacities and prime costs.

A head select/read channel preamplifier 28 is preferably included within the HDA 12 in close proximity to the thin film heads 26 to reduce noise pickup. As is conventional, the preamplifier 28 is preferably mounted to, and connected by, a thin flexible plastic printed circuit substrate. A portion of the flexible plastic substrate extends exteriorly of the HDA 12 to provide electrical signal connections with the circuitry carried on the PCB 14. Alternatively, and equally preferably, the preamplifier 28 may be connected to the other circuitry illustrated in FIG. 4 exteriorly of the HDA 12 in an arrangement as described in the referenced copending U.S. patent application Ser. No. 07/881,678, filed on May 12, 1992, and entitled "Hard Disk Drive Architecture".

A bidirectional user data path 30 connects the digital integrated circuit 17 with the data sequencer and memory controller 19. The data path 30 from the sequencer 19 enters an encoder/decoder ("ENDEC") 32 which also functions as a serializer/deserializer ("SERDES"). In this preferred embodiment, the ENDEC 32 converts the binary digital byte stream into coded data sequences in accordance with a predetermined data coding format, such as (0,4,4) code. This coded serial data stream is then delivered over a path 33 to a precoder 34 which precodes the data in accordance with the PR4 precoding algorithm $1/(1 \oplus D^2)$. The precoded data is then passed over a path 35 to a write driver circuit 36 within the analog IC 15 wherein it is amplified and precompensated by a write precompensation circuit 774 and is then delivered via a head select function within the circuit 28 to the selected data transducer head 26. The head 26 writes the data as a pattern of alternating flux transitions within a selected data track 71 of a block 72 of data tracks defined on a selected data storage surface of the disk 16, see FIGS. 5 and 6. Embedded servo patterns are written by a servo writer, preferably in accordance with the methods described in a commonly assigned U.S. patent application Ser. No. 07/569,065 filed on Aug. 17, 1990, entitled "Edge Servo For Disk Drive Head positioner, now U.S. Pat. No. 5,170,299, the disclosure thereof being hereby incorporated by reference.

Returning to FIG. 4, during playback, flux transitions sensed by the e.g. thin film data transducer head 26 as it flies in close proximity over the selected data track 71 are preamplified by the read preamplifier circuit 28. The preamplified analog signal (or "read signal") is then sent to the analog IC 15 on a path 29 and into an analog variable gain amplifier (VGA) 37, a fixed gain amplifier 38, and a second VGA 39. After controlled amplification, the read signal is then passed through a programmable analog filter/equalizer stage 40. During non-read times, an analog automatic gain control circuit 42 feeds an error voltage to a control input of the VGA 37 over a control path 43. During read times, a digital gain control value from a digital gain control circuit 64 is converted into an analog value by a gain DAC 66 and applied over a path to control the second VGA 39, while the analog error voltage on the path 43 is held constant.

The analog filter/equalizer 40 is programmed so that it is optimized for the data transfer rate of the selected data zone 70 from within which the transducer head 26 is reading data. The equalized analog read signal is then subjected to sampling and quantization within a high speed flash analog to digital (A/D) converter 46 which, when synchronized to user data, generates raw data samples $\{x_k\}$.

Figure 1:
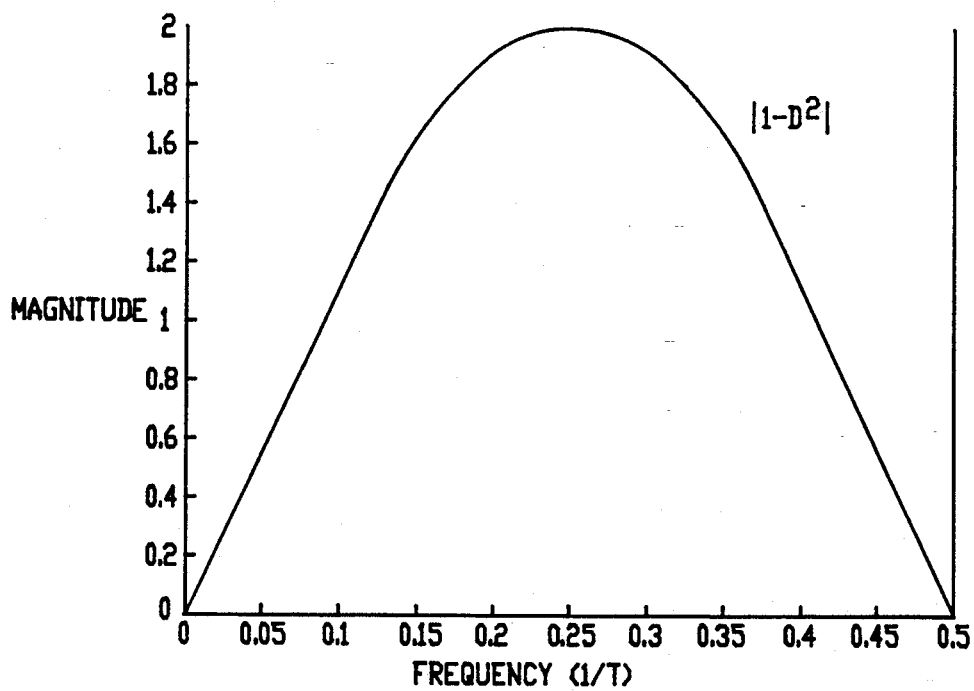
FIG. 1 is a graph of an idealized PR4 channel magnitude response spectrum.
Figure 2:
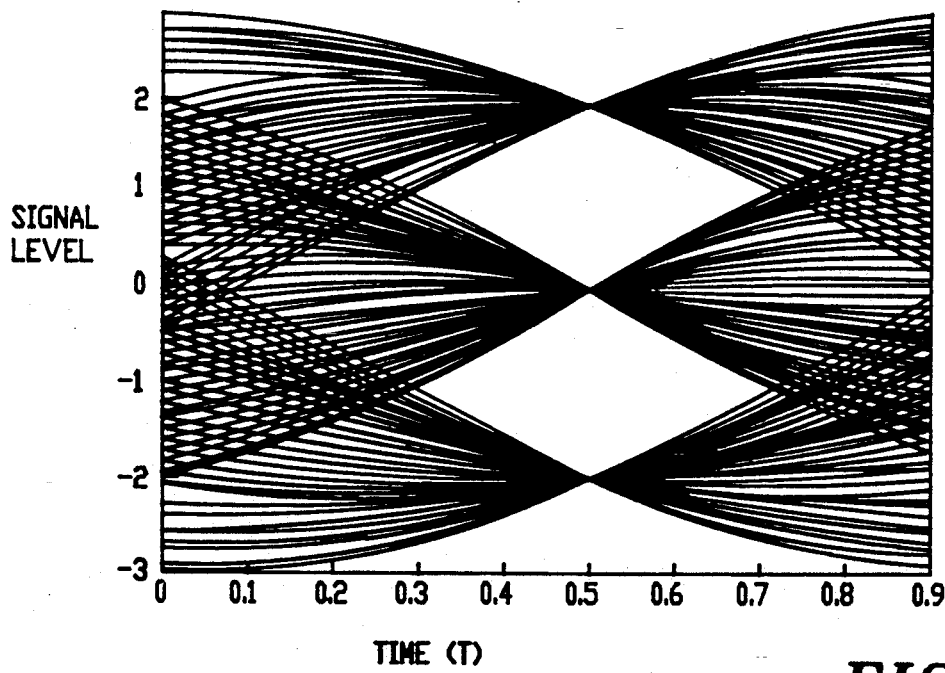
FIG. 2 is an exemplary ternary or "eye" diagram illustrating detection of signal levels in a PR4 channel.
Figure 3:
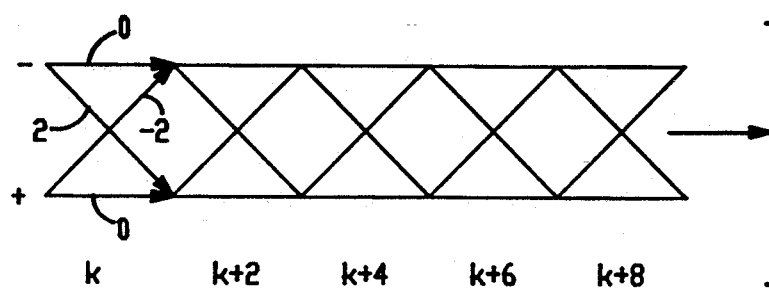
FIG. 3 is a trellis diagram employed by a Viterbi detector in detecting a maximum likelihood data sequence occurring within one interleave of a PR4 data stream.

The FIR filter 48 employs adaptive filter coefficients for filtering and conditioning the raw data samples $\{x_k\}$ in accordance with the desired PR4 channel response characteristics, as plotted in FIG. 1, in order to produce filtered and conditioned samples $\{y_k\}$. The bandpass filtered and conditioned data samples $\{y_k\}$ leaving the filter 48 are then passed over a path 49 to the Viterbi detector 50 which detects the data stream, based upon the Viterbi maximum likelihood algorithm employing a lattice pipeline structure implementing a trellis state decoder of the type illustrated in FIG. 3, for example. At this stage, the decoded data put out on a path 96 is in accordance with a (0,6,5) coding convention. A postcoder 52 receives the (0,6,5) coded data stream and restores the original (0,4,4) coding convention to the decoded data. The restored (0,4,4) coded data stream is decoded from the (0,4,4) code and deserialized by the ENDEC/SERDES 32 which frames and puts out eight bit user bytes which then pass into the sequencer 19 over the data path 30.

In order for the present system to work properly, the raw data samples $\{xk\}$ must be taken on the incoming analog signal waveform at precisely proper, regular locations. A dual mode timing loop is provided to control the frequency and phase of the flash analog to digital converter 46. The timing loop includes an analog timing control circuit 60, and a digital timing control circuit 54 and a timing DAC 57. A timing phase locked synthesizer circuit 262 supplies synthesized timing signals to the control circuit 60 and a timing reference signal to a summing junction 58. A sum put out by the summing junction 58 controls a current controlled oscillator 62 in order to clock the A/D 46. The oscillator 62 also includes zero phase start circuitry to provide controlled startup at an approximately correct phase with the incoming data samples.

In order to achieve full utilization of the flash A/D 46, a dual mode gain loop is also provided. The gain loop includes the analog gain control circuit 42 which controls the first VGA 37, and a digital gain control circuit 64 and the gain DAC 66 which controls the second VGA 39.

Data Recording Pattern

Figure 5:
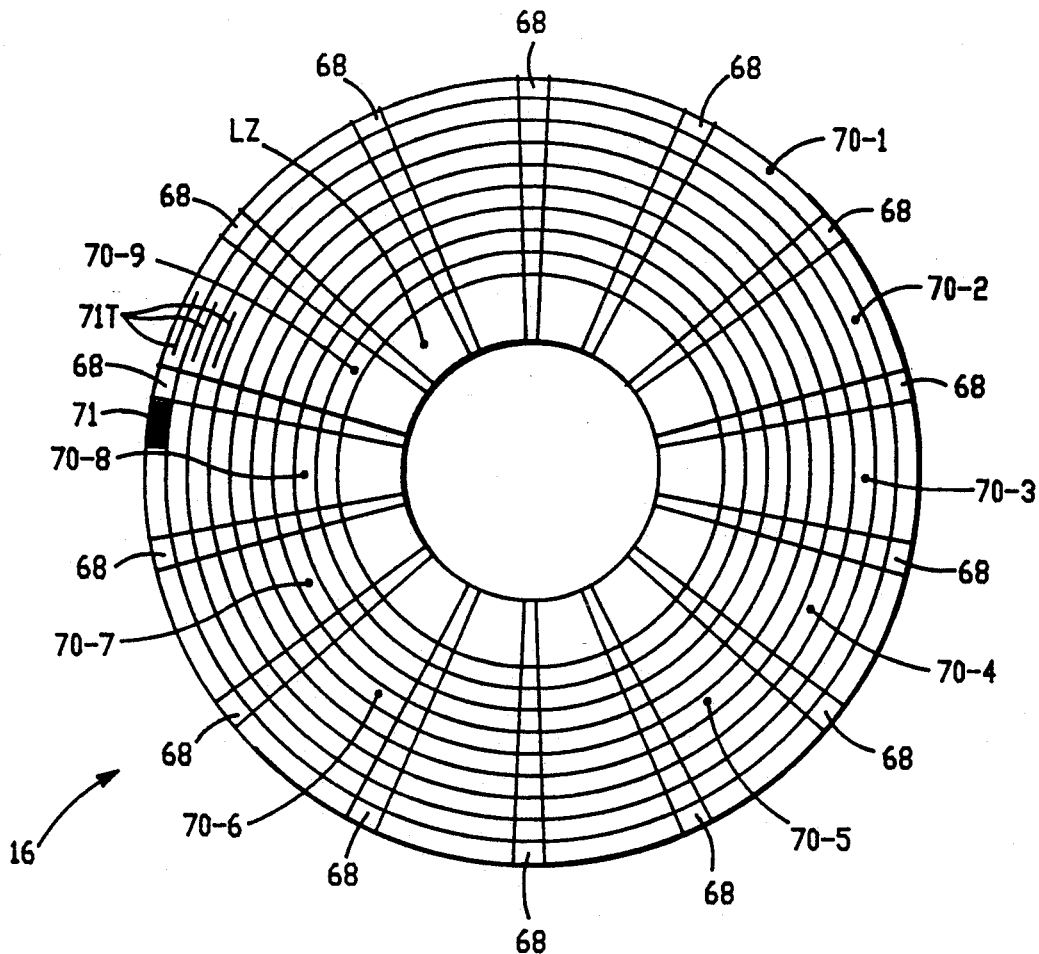
FIG. 5 is a simplified diagram of a recording pattern formed on a data storage surface of the FIG. 4 disk drive, illustrating data zones and embedded servo sector patterns.

As shown in FIG. 5, an exemplary data storage surface of a storage disk 16 comprises a multiplicity of concentric data tracks 71 which are preferably arranged in a plurality of data recording zones 70 between an inner landing zone area LZ and a radially outermost peripheral data track zone 70-1. In the illustrated example, the data tracks are shown as arranged into e.g. nine data zones including the outermost zone 70-1, and radially inward zones 70-2, 70-3, 70-4, 70-5, 70-6, 70-7, 70-8 and 70-9, for example. In practice, more zones, such as 16 zones, are presently preferred. Each data zone has a bit transfer rate selected to optimize areal transition domain densities for the particular radius of the zone. Since the number of available magnetic storage domains varies directly as a function of disk radius, the tracks of the outermost zone 70-1 will be expected to contain considerably more user data than can be contained in the tracks located at the innermost zone 70-9. The number of data fields, and the data flux change rate will remain the same within each data zone, and will be selected as a function of radial displacement from the axis of rotation of the storage disk 16.

Figure 6:
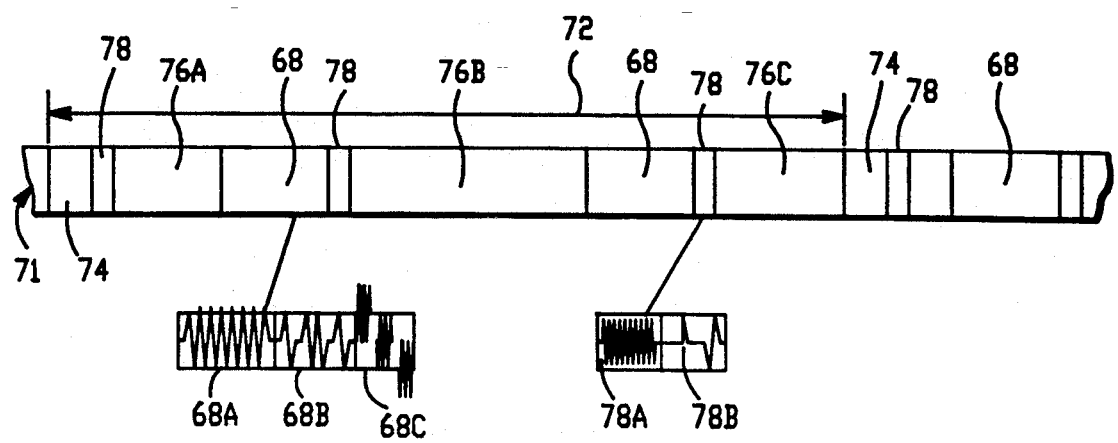
FIG. 6 is an enlarged lineal depiction of a segment of one data track within the multiplicity of data tracks defined within the FIG. 5 data layout plan, illustrating one data field which has been split into segments by regularly occurring embedded servo sectors.

FIG. 5 also depicts a series of radially extending embedded servo sectors 68 which e.g. are equally spaced around the circumference of the disk 16. As shown in FIG. 6, each servo sector includes a servo preamble field 68A, a servo identification field 68B and a field 68C of circumferentially staggered, radially offset, constant frequency servo bursts, for example. In addition to data fields 76 which store user data information and error correction code syndrome remainder values, for example, each data track has certain overhead information such as the FIG. 6 data block header fields 74, and data block ID fields 78. While the number of data sectors per track varies from data zone to data zone, in the present example, the number of embedded servo sectors 68 per track remains constant throughout the surface area of the disk 16. In this present example the servo sectors 68 extend radially and are circumferentially equally spaced apart throughout the extent of the storage surface of the disk 16 so that the data transducer head 26 samples the embedded servo sectors 68 while reading any of the concentric tracks defined on the data storage surface. Also, the information recorded in the servo ID field 68B of each servo sector 68 is e.g. prerecorded with servowriting apparatus at the factory at a predetermined relative low constant frequency, so that the servo information will be reliable at the innermost track location, e.g. within the innermost zone 70-9. While regular servo sectors are presently preferred, a pattern of servo sectors aligned with data sectors and therefore unique within each data zone 70 is also within the contemplation of the present invention. Such a pattern is illustrated in U.S. Pat. No. 4,016,603, to Ottesen, for example, the disclosure thereof being hereby incorporated by reference.

Each data sector is of a predetermined fixed storage capacity or length (e.g. 512 bytes of user data per data sector); and, the density and data rates vary from data zone to data zone. Accordingly, it is intuitively apparent that the servo sectors 68 interrupt and split up at least some of the data sectors or fields into segments, and this is in fact the case in the present example. The servo sectors 68 are preferably recorded at a single data cell rate and with phase coherency from track to track with a conventional servo writing apparatus at the factory. A laser servo writer and head arm fixture suitable for use with the servo writer are described in commonly assigned U.S. Pat. No. 4,920,442, the disclosure of which is hereby incorporated herein by reference. A presently preferred servo sector pattern is described in the referenced, copending U.S. patent application Ser. No. 07/569,065.

As shown in FIG. 6, a data track 71 includes a data block 76 for storage of a predetermined amount of user data, such as 512 or 1024 bytes of user data, recorded serially in 0,4,4 code bits in data field segments 76A, 76B and 76C of the depicted track segment. The data block 76 is shown in FIG. 6 to be interrupted and divided into segments of unequal length by several servo sectors 68 which contain embedded servo information providing head position information to the disk drive 10. Each data block 76 includes a block ID header field 74 at the beginning of the data block and a data ID header field 78 immediately preceding each data field segment including the segment 76A following the ID header 74, and the segments 76B and 76C following interruption by servo sectors 68. The data header field 78 is written at the same time that data is written to the segments 76A, 76B and 76C for example, and write splice gaps therefore exist just before each data ID header 78, before ID fields, and before servo fields, for example.

ENDEC/SERDES 32

The ENDEC/SERDES 32 is a combination of two acronyms: ENDEC=encoder/decoder; and SERDES=serializer/deserializer. The endec/serdes 32 combines two necessary functions: encoding and decoding eight bit user data bytes into and from nine-bit code words, thereby achieving the desired 8/9ths coding arrangement of the 0,4,4 PR4,ML channel; and, serializing and deserializing the 9-bit code words for serial recording onto, and from serial playback from, the selected data block on a disk storage surface 16.

Encoder/Decoder

Those skilled in the art will appreciate that there are 256 eight-bit byte combinations, and there are 279 possible nine-bit code word combinations which maintain the (0,4,4) code integrity. If M represents the eight-bit universe of bytes, and N represents the nine-bit universe of code words, a suitable mapping algorithm may be employed to map between M and N. In one preferred example 110 characters are mapped by directly transferring the eight bit M value and adding a zero at the 9th (MSB) position. 59 other characters are mapped by directly transferring the eight bit M values and adding a one at the 9th (MSB) position. 47 characters are mapped as the two's complement of the eight bit M value and adding a one at the 9th (MSB) position. The remaining 39 characters are mapped by a table lookup arrangement. In this arrangement two sync values are written at the beginning of the data block during encode, and are decoded during decode. The following Verilog program sets forth the logical equations needed to carry out the encoder mapping described herein. In this program, the following conventions are employed: "b" means binary; "o" means octal; "h" means hexadecimal; "!=" means not equal; "==" means equal; "&" means logical AND, and "~" means total bit inversion.

```
'define c1 {encin [7:6]}
'define c2 {encin [2:0]}
'define c3 {encin [4], encin [2], encin [0]}
'define c4 {encin [7], encin [5], encin [3]}
'define c5 {encin [5:1]}
'define c6 {encin [6:2]}
'define c7 {encin [6], encin [4]}
'define c8 {encin [5], encin [3], encin [1]}
'define c9 {encin [7:3]}
*/
begin
/*
```

-continued

```
if (syncdata)
begin
$display ("This is in endec block syncdata %h", syncdata);
    encout = {encin{7:1],1'b1,encin[0]};
end
else
begin
*/
encout [8] = !syncdata & !case1;
encout [7] = bit 7 ∧ encin [7];
encout [6] = bit 6 ∧ encin [6];
encout [5] = bit 5 ∧ encin [5];
encout [4] = bit 4 ∧ encin [4];
encout [3] = bit 3 ∧ encin [3];
encout [2] = bit 2 ∧ encin [2];
encout [1] = bit 1 ∧ encin [1];
encout [0] = bit 0 ∧ encin [0];
/*
encout = {1'b1, encin};
case (encin) // synopsys parallel_case
8'h00: encout [7:0] = 8'hf2;
8'h07: encout [7:0] = 8'hf1;
8'h15: encout [7:4] = 4'he;
8'h17: encout [7:0] = 8'hf4;
8'h2a: encout [7:0] = 8'hd9;
8'h47: encout [3:0] = 4'hd;
8'h50: encout [7:0] = 8'h63;
8'h51: encout [3:0] = 4'h9;
8'h52: encout [3:0] = 4'ha;
8'h53: encout [3:0] = 4'hb;
8'h54: encout [3:0] = 4'hc;
8'h55: encout [7:0] = 8'h6c;
8'h56: encout [3:0] = 4'he;
8'h57: encout [7:0] = 8'h6d;
8'h58: encout [7:0] = 8'h66;
8'h6a: encout [3:0] = 4'h9;
8'h70: encout [3:0] = 4'h3;
8'h78: encout [3:0] = 8'h6;
8'h95: encout [3:0] = 4'hc;
8'ha8: encout [7:0] = 8'h96;
8'haa: encout [7:0] = 8'h99;
8'hb8: encout [3:0] = 4'h6;
8'hc0: encout [3:0] = 4'h3;
8'hc1: encout [3:0] = 4'hb;
8'hc2: encout [3:0] = 4'hd;
8'hc4: encout [3:0] = 4'he;
8'hc5: encout [3:0] = 4'hc;
8'hc8: encout [3:0] = 4'h6;
8'hea: encout [3:0] = 4'h9;
8'hd0: encout [3:0] = 4'h3;
8'hd1: encout [3:0] = 4'hb;
8'hd4: encout [3:0] = 4'he;
8'hd5: encout [3:0] = 4'hc;
8'hd8: encout [3:0] = 4'h6;
8'he0: encout [3:0] = 4'h3;
8'he8: encout [3:0] = 4'h6;
8'hea: encout [3:0] = 4'h1;
8'hf0: encout [3:0] = 4'h3;
8'hf8: encout [3:0] = 4'h6;
default: begin
    if ('c1 != 2'b00 & 'c2 != 3'o0 & 'c3 != 3'o0 & 'c4 !=3'o0 &
       'c5 != 5'h00 &'c6 ! = 5'h00 & 'c7 != 2'o0 &
       'c8 != 3'o0)
       encout[8] = 1'b0;
    else begin
       if (!(('c1 = = 2'b00 | 'c7 = = 2'b00) & 'c2 != 3'o0 &
          'c3 != 3'o0 & 'c4 != 3'o0 & 'c5 != 5'h00 &
          'c6 != 5"h00 & 'c8 != 3'o0 & 'c9 != 5'h00))
          encout = ~encin;
end
```

The decoder operates in accordance with an inverse of the logic described by the foregoing logic equations. With this arrangement the entire logical structure required for implementing the foregoing logic equations comprises approximately 150 gates of an application-specific integrated circuit. Other, less preferred approaches require upwards of 400 gates or more to carry out the encoding and decoding function.

Serdes

Figure 7:
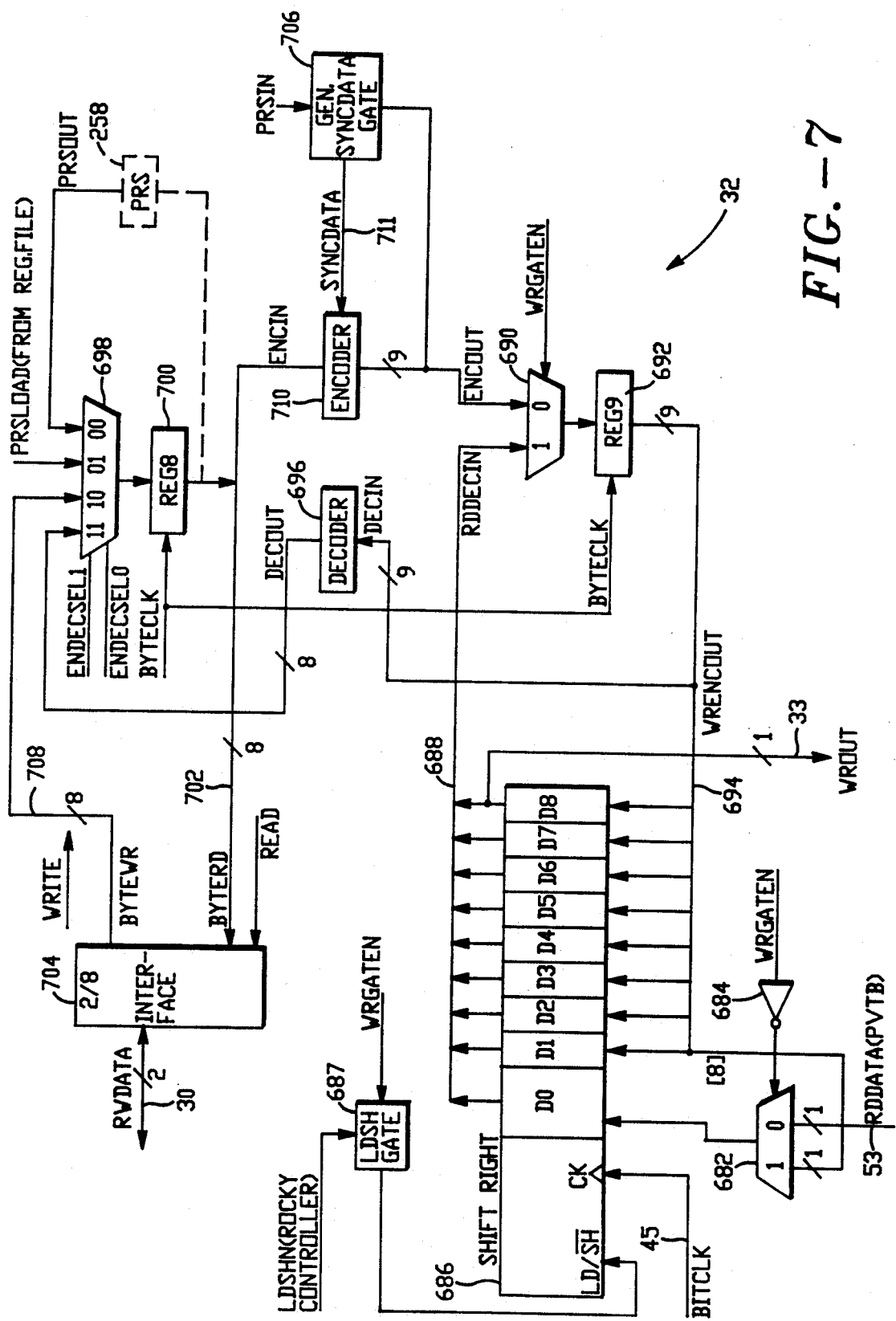
FIG. 7 is a block diagram of an ENDEC/SERDES circuit of the FIG. 4 PR4, ML disk drive architecture.

Turning now to FIG. 7, the ENDEC/SERDES 32 receives serial data during read mode from the postcoder 52 via a serial data path 53. This coded serial data read back from the disk surface is passed through a multiplexer 682 and into a first bit position D0 of a nine-bit shift-right shift register 686. The incoming coded data bits are then clocked to the right within the shift register 686 by the BITCLK clock signal on a path 45. The shift register 686 is operated by a load-shift control signal LDSHFTN in which a logical high condition signals a parallel load operation and a logical low condition signals a serial shift operation. The LDSHFTN control is put out by a load-shift gate 687 which selects between load and shift control modes in accordance with a signal generated by the digital IC controller. During a data read sequence, once a nine-bit code word is framed in the shift register 686, it is fed onto a nine bit code word bus 688.

The nine-bit code word on the path 688 passes through a selector 690 and is then clocked into a nine-bit register 692 by a BYTECLK signal. In order to preclude a race between the BITCLK clock signal on the path 45 and the BYTECLK clock signal on a path 689, during read mode, the BYTECLK clock signal transitions true (rising edge) upon a falling edge of the BITCLK clock phase during a ninth bit cycle thereof. This is so that the latch register 692 is written after the ninth bit has arrived in the shift register 686 and before the first bit of the next code word comes in.

The code word values held in the register 692 are then clocked out over a bus 694 to a decoder 696 at the BYTECLK clock rate. The decoder 696 decodes the code words into eight bit data bytes in accordance with an inverse of e.g. the N to M mapping scheme described above in connection with the encoder 710. The decoder 696 puts out decoded eight-bit data bytes over a path 697 to a multiplexer 698 which passes the bytes to a register 700 during read mode.

The register 700, clocked by the BYTECLK signal on the path 689, puts out the data bytes over a path 702 and through e.g. an eight bit to two bit data buffer 704 which is provided to minimize the number of external pin connections of the digital IC 17. The outgoing two bit groups are then sent onto the two-bit bidirectional data path 30 leading into the sequencer 19, where they are formatted and checked for error correction, etc., and sent onto the buffer 21 for delivery to the interface 23 and host computing environment via the bus 25.

During data writing operations, a different signal path is followed. Eight bit data bytes to be written to disk enter the ENDEC/SERDES 32 as two-bit groups via the bus 30 and are passed through the buffer 704 to a path 708 leading to and through the multiplexer 698 and to the register 700. These bytes are then clocked out to the encoder 710 over the bus 702 in accordance with the BYTECLK signal on the path 689. The bytes on the path 702 entering the encoder 710 are mapped into nine-bit code words in accordance with the N to M mapping scheme described above.

In order to provide a sync field immediately following each data write splice, a control SYNCDATAN on a path 711 is provided to control the operation of the encoder 710. If SYNCDATAN is equal to one, the data preamble sync field 78 is to be written. In one preferred example, the sequencer 19 will put out eight bytes. The first six bytes will be data words FF(Hex). The seventh byte will be 02 (Hex) and the eighth byte will be 07 (Hex). During this sync field interval, the SYNCDATA value will be true, indicating that the sync field pattern is to be written as a sinewave burst, and that no encoding is to be performed, i.e. a 1,1111,1111 nine-bit code pattern for each of the first six bytes is to be written. During this time period, the encoder 710 merely appends an additional 1 bit to the eight 1 bit values of each byte to come up with a string of nine 1s for each code word. The seventh data byte becomes encoded to 0 0000 0110, and the eight byte becomes encoded to 0 0000 1111, for example.

A sync/data gate 706 monitors the output data stream from the encoder 710 and detects the pattern of the eighth byte. When this detection occurs, the SYNCDATA control changes from high to low, signifying that a data pattern is now to be encoded, and the encoder 710 is enabled to operate normally in encoding the data bytes into nine bit code words in accordance with the predetermined coding arrangement as described above implemented within the encoder 710.

The nine bits put out from the encoder 710 are selected through the selector 690 and loaded into the latch register 692. These bits are then clocked out to the bus 694 by the BYTECLK signal on the path 689 and are then loaded in parallel into the nine positions of the shift register 686 in accordance with the LOSHFTN control from the load/shift gate 687, and clocked out serially over the path 33 to the precoder 34 in accordance with the BITCLK signal As was true during read mode, during write mode the BYTECLK clock signal is phase-adjusted with respect to the BITCLK clock signal in order to prevent a race between shift operations of the shift register 686 and parallel load operations. During write mode, the BYTECLK clock signal transitions true (rising edge) when the BITCLK clock signal transitions false (falling edge) within a data bit one clock cycle. This assures that a parallel load operation is carried out after the last (ninth) bit of the last code word has been shifted out of the shift register 686.

The four-input multiplexer 698 includes two additional inputs: one comprising a pseudo-random sequence preload value from the register file of the digital chip 17, and another from the pseudo-random sequence generator 258. These additional inputs are used during FIR filter coefficients training mode. The generator 258, implemented in hardware on the digital chip 17, receives an output on the path 702 from the register 700 and modifies the output recursively in accordance with its rules of operation and supplies the output to the fourth input of the multiplexer.

FIR filter training using the present circuit arrangement is described in the U.S. patent application referred to at the beginning of this application Ser. No. 07/937,064.

Precoder 34

Figure 8:
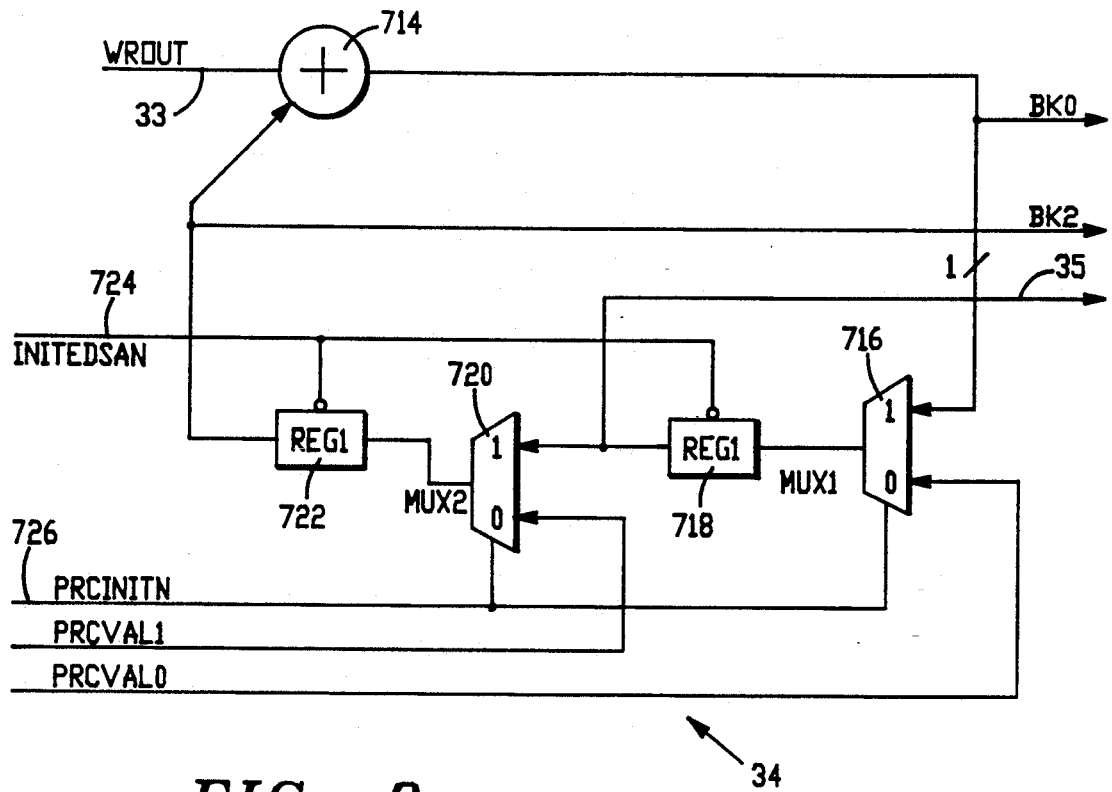
FIG. 8 is a block diagram of a precoder circuit of the FIG. 4. PR4, ML disk drive architecture.

FIG. 8 sets forth the precoder in greater detail. The data to be written to disk put out on the path 33 is passed through an exclusive OR function 714. The resultant value BK0 is passed through a multiplexer 716 to a first register 718. The signal BK1 put out from the first register 718 is then passed through a second multiplexer 720 to a second register 722. The signal BK2 put out from the second register 722 is also provided as an input to the exclusive OR gate 714. The registers 718 and 722 are cleared by a clear command on a path 724. Two precoder preset values PRCVAL0 and PRCVAL1 from the register file 804 are preloaded into the registers 718 and 722 by an initialization signal on a path 726. As illustrated, the precoder 34 precodes the code word data into the desired function $(1/1 \oplus D^2)$.

Postcoder 52

Figure 9:
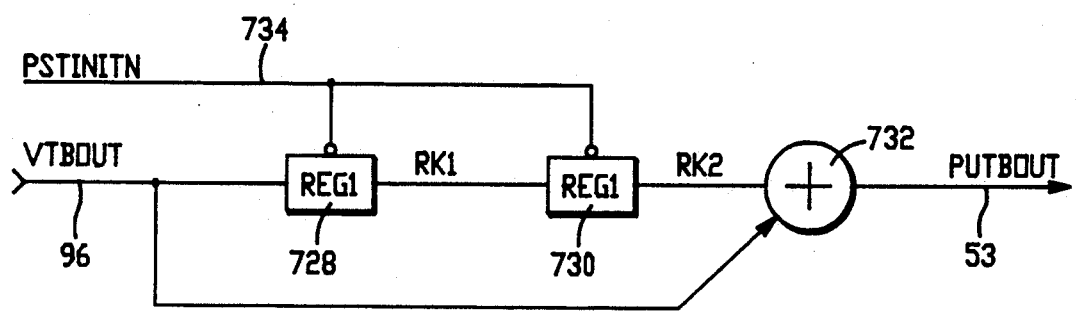
FIG. 9 is a block diagram of a postcoder circuit of the FIG. 4 PR4, ML disk drive architecture.

The postcoder 52 is shown structurally in FIG. 9. Decoded code word patterns from the Viterbi detector 50 enter the postcoder 52 via a path 96. In the postcoder 52, the serial values are latched into a first register 728 which provides an output value RK1. This value is then passed through a second register 730 which provides a second output value RK2. The RK2 value, together with the incoming value on the path 96 are compared in an exclusive OR function 732 with a result put out as postcoded decoded nine-bit code words to the ENDEC/SERDES 32 over the path 53. The postcoder thus decodes the played back code word stream in accordance with the desired function $(1 \oplus D^2)$ which restores the desired 8/9ths code to the code words before they are decoded in the ENDEC/SERDES 32 and put out to the sequencer 19 as user data bytes.

Having thus described an embodiment of the invention, it will now be appreciated that the objects of the invention have been fully achieved, and it will be understood by those skilled in the art that many changes in construction and widely differing embodiments and applications of the invention will suggest themselves without departing from the spirit and scope of the invention. The disclosure and the description herein are purely illustrative and are not intended to be in any sense limiting.

What is claimed is:

1. A serializing/deserializing encoder-decoder for a disk drive including a serial write data channel leading to a data transducer head for writing data to a rotating data storage disk during a write mode, a serial read data channel leading from the data transducer head for reading data from the disk during a read mode, and data sequencer means for writing sequences of data words to the data storage disk via the encoder-decoder and the write data channel during write mode, and for reading sequences of data words from the disk via the read data channel and the encoder-decoder during read mode, the serializing/deserializing encoder-decoder comprising:

data word selector means for selectively receiving data words from the data sequencer means during write mode, and for selectively sending data words to the data sequencer means during read mode, encoder means receiving data words from the data word selector means during write mode for converting the data words into predetermined code words in accordance with a predetermined coding pattern, decoder means receiving code words during read mode for converting the code words into data words in accordance with the predetermined coding pattern, a code word selector means connected to receive and selectively put out code words from the encoder means during write mode, and connected to receive and selectively put out code words to the decoder means during read mode, and serializer/deserializer means for converting code words received from the code word selector means into a serial data stream and for sending said stream to said write data channel during write mode, and for converting a serial data stream received from said read data channel into code words and for sending said code words to said code word selector means during read mode.

2. The serializing/deserializing encoder-decoder set forth in claim 1 wherein the data channels of said disk drive implement a PR4,ML synchronously sampled data channel, and wherein said data word selector means comprises an eight bit selector, and wherein said code word selector means comprises a nine bit selector, and wherein said encoder means and said decoder means implement said coding pattern in accordance with a predetermined eight bit to nine bit coding pattern.

3. The serializing/deserializing encoder-decoder set forth in claim 2 wherein the serializer/deserializer means comprises a universal parallel load, parallel read, serial load, serial shift nine bit shift register.

4. The serializing/deserializing encoder-decoder set forth in claim 2 wherein said read data channel includes postcoder means for postcoding detected data samples in an (0,6,5) code format into said code words in accordance with a (0,4,4) code format, and wherein said write data channel includes precoder means for precoding code words in said (0,4,4) format into precoded data groups in said (0,6,5) format 5. The serializing/deserializing encoder-decoder set forth in claim 4 wherein the encoder means converts eight bit data words into nine bit code words in accordance with a predetermined coding arrangement in consonance with the (0,4,4) code format, and wherein the decoder means decodes nine bit code words into eight bit data words in accordance with an inverse of the predetermined coding arrangement.

6. The serializing/deserializing encoder-decoder set forth in claim 4 wherein said postcoder means comprises two tandem connected registers clocked at a data sampling rate and an exclusive-OR gate for comparing an incoming detected data sample with a two-register delayed data sample to provide a post coded code word.

7. The serializing/deserializing encoder-decoder set forth in claim 4 wherein said precoder means comprises an exclusive-OR gate connected to receive incoming code words and to provide an output, and two tandem connected registers clocked at a data sampling rate, a first register for delaying the output by one clock period and for putting out said precoded data groups, and a second register for delaying an output of the first register by one clock period and for providing another input to the exclusive-OR gate.

8. The serializing/deserializing encoder-decoder set forth in claim 1 wherein said data word selector means comprises a multiplexer means for selecting from one of at least three inputs, and a first register means for holding an output selected from one of the inputs by the multiplexer means, the first register means having an output connected to the encoder means and to the sequencer means.

9. The serializing/deserializing encoder-decoder set forth in claim 8 further comprising a source of pseudo-random sequence data words, and wherein the multiplexer means receives at one of its inputs and selectively puts out pseudo-random sequence data words to the first register means.

10. The serializing/deserializing encoder-decoder set forth in claim 1 wherein said code word selector means comprises a multiplexer means for selecting one of plural inputs and having one input connected to the encoder means and another input connected to a parallel output path from the serializer/deserializer means, and having an output connected to a second register means for holding data put out by the multiplexer means, the second register means having an output connected to a parallel input path to the serial/decserializer means and to the decoder means.

11. The serializing/deserializing encoder-decoder set forth in claim 1 wherein said encoder means further comprises a sync/data field gate means connected in parallel therewith for detecting an end of a data sync field preamble and for enabling encoding of user data words immediately following the end of the preamble.

12. The serializing/deserializing encoder-decoder set forth in claim 1 wherein said read data channel includes postcoder means for postcoding detected data samples into said code words.

13. The serializing/deserializing encoder-decoder set forth in claim 1 wherein said write data channel includes precoder means for precoding said code words into precoded data groups for recording on said disk surface.

* * * * *